(12) United States Patent
Akatsu et al.

(10) Patent No.: US 7,615,457 B2
(45) Date of Patent: Nov. 10, 2009

(54) METHOD OF FABRICATING SELF-ALIGNED BIPOLAR TRANSISTOR HAVING TAPERED COLLECTOR

(75) Inventors: Hiroyuki Akatsu, Yorktown Heights, NY (US); Rama Divakaruni, Ossining, NY (US); Gregory G. Freeman, Hopewell Junction, NY (US); David R. Greenberg, White Plains, NY (US); Marwan H. Khater, Poughkeepsie, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/220,521

(22) Filed: Jul. 25, 2008

(65) Prior Publication Data

US 2008/0318373 A1 Dec. 25, 2008

Related U.S. Application Data

(62) Division of application No. 10/708,340, filed on Feb. 25, 2004, now Pat. No. 7,425,754.

(51) Int. Cl.
*H01L 21/265* (2006.01)
*H01L 27/102* (2006.01)

(52) U.S. Cl. .................. 438/366; 438/320; 438/341; 438/350; 257/49; 257/197; 257/649; 257/E21.696; 257/E27.055

(58) Field of Classification Search ............... 438/320, 438/350, 366; 257/197, 565, 649
See application file for complete search history.

(56) References Cited

U.S. PATENT DOCUMENTS

| | | | |
|---|---|---|---|
| 5,101,256 A | 3/1992 | Harame et al. | |
| 5,128,271 A | 7/1992 | Bronner et al. | |
| 5,320,972 A * | 6/1994 | Wylie | 438/366 |
| 5,481,120 A * | 1/1996 | Mochizuki et al. | 257/49 |
| 5,494,836 A | 2/1996 | Imai | |
| 5,506,427 A | 4/1996 | Imai | |
| 5,668,396 A | 9/1997 | Sato | |
| 5,766,999 A | 6/1998 | Sato | |
| 5,798,561 A | 8/1998 | Sato | |
| 5,962,880 A | 10/1999 | Oda et al. | |
| 6,287,930 B1 | 9/2001 | Park | |
| 6,346,453 B1 | 2/2002 | Kovacic et al. | |
| 6,429,085 B1 | 8/2002 | Pinter | |
| 6,437,376 B1 | 8/2002 | Ozkan | |
| 6,472,262 B2 | 10/2002 | Chantre et al. | |
| 6,559,020 B1 | 5/2003 | Salmi | |
| 6,680,494 B2 | 1/2004 | Gutierrez-Aitken et al. | |

* cited by examiner

*Primary Examiner*—Dao H Nguyen
(74) *Attorney, Agent, or Firm*—Daryl K. Neff; B. Daniel Schnurmann

(57) ABSTRACT

A method is provided for making a bipolar transistor which includes a tapered, i.e. frustum-shaped, collector pedestal having an upper substantially planar surface, a lower surface, and a slanted sidewall extending between the upper surface and the lower surface, the upper surface having substantially less area than the lower surface. The collector pedestal can be formed on a surface of a collector active region exposed within an opening extending through first and second overlying dielectric regions, where the opening defines vertically aligned edges of the first and second dielectric regions.

8 Claims, 10 Drawing Sheets

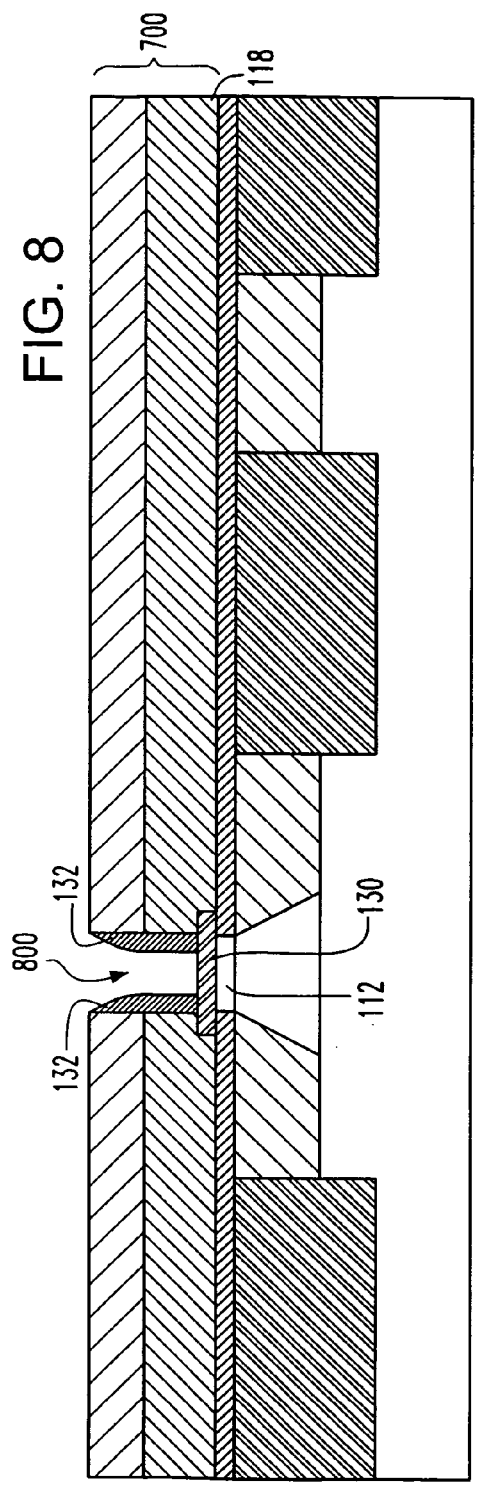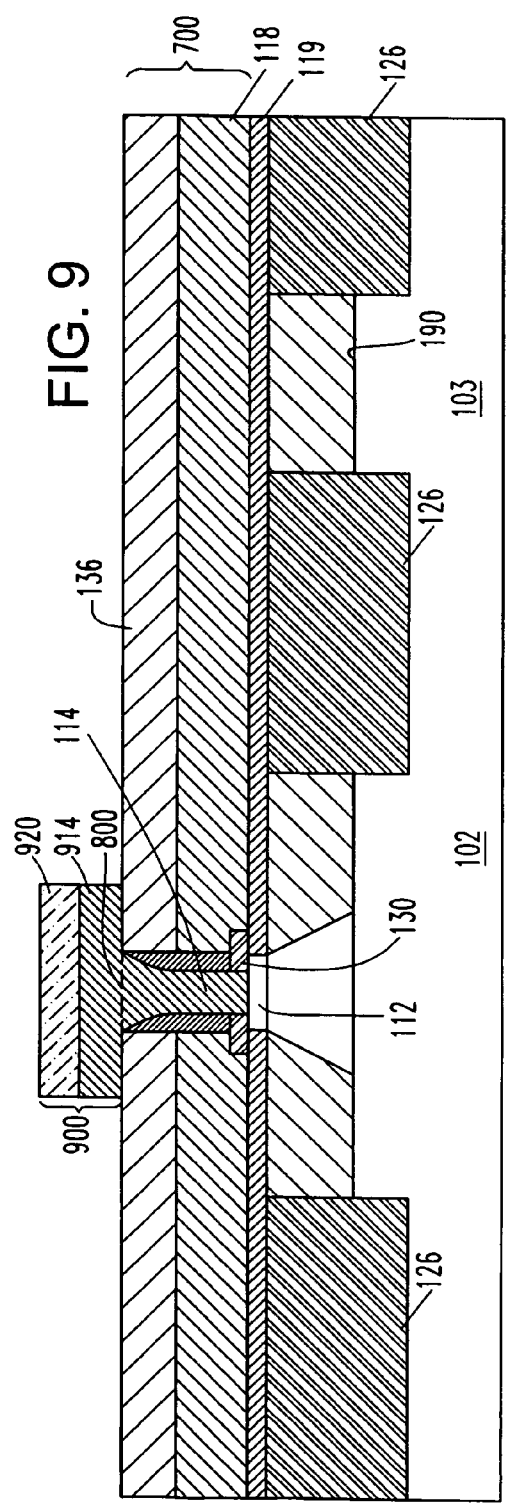

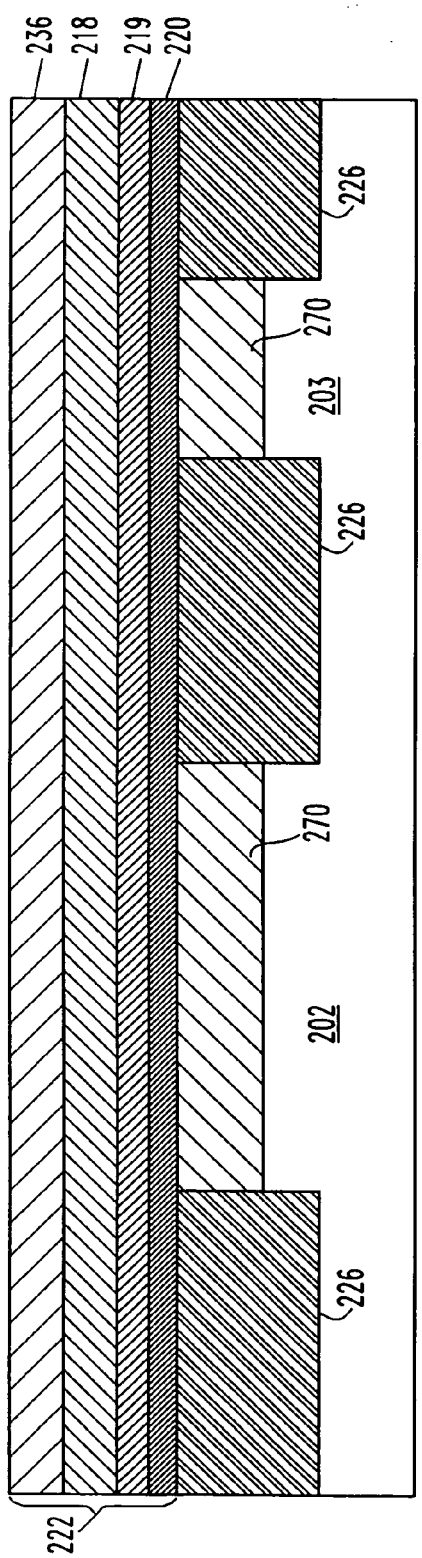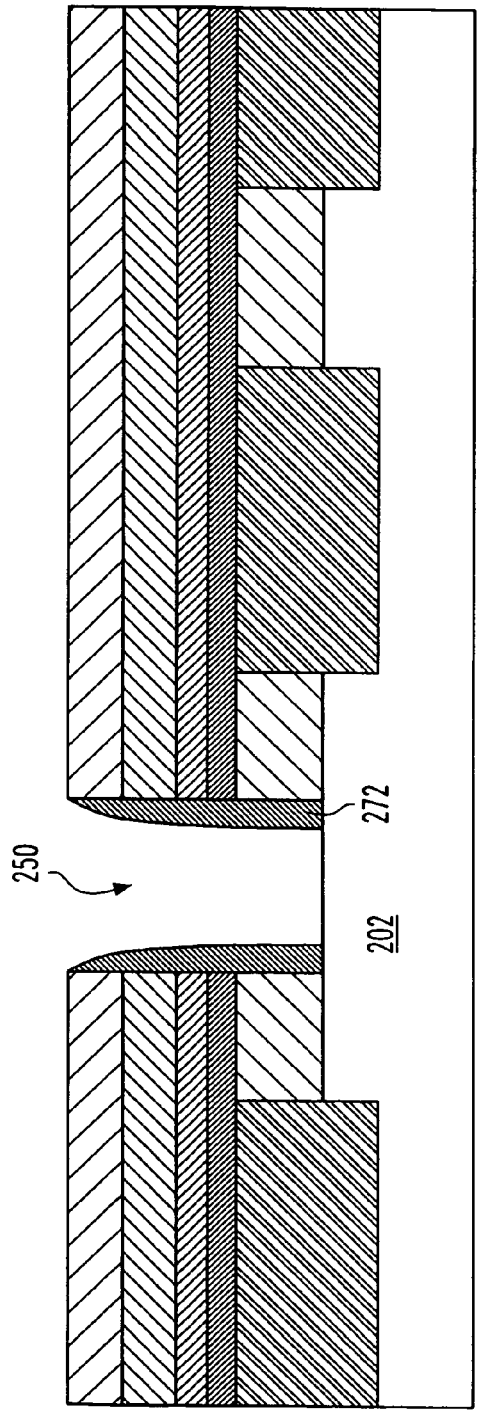

METHOD OF FABRICATING SELF-ALIGNED BIPOLAR TRANSISTOR HAVING TAPERED COLLECTOR

CROSS-REFERENCE TO RELATED APPLICATION

This application is a divisional of U.S. application Ser. No. 10/708,340 filed Feb. 25, 2004, the disclosure of which is incorporated herein by reference.

BACKGROUND OF THE INVENTION

High performance circuits, especially those used for radio frequency chips, favor the use of heterojunction bipolar transistors (HBTs) to provide high maximum oscillation frequency $f_{MAX}$ and high transient frequency $f_T$, also referred to as "cutoff frequency". HBTs have a structure in which the base of the transistor includes a relatively thin layer of single-crystal semiconductor alloy material. As an example, an HBT fabricated on a substrate of single-crystal silicon can have a single-crystal base formed of silicon germanium (SiGe) having substantial germanium content and profile to improve high-speed performance. Such HBT is commonly referred to as a SiGe HBT.

The juxtaposition of alloy semiconductor materials within a single semiconductor crystal is called a "heterojunction." The heterojunction results in an increase in current gain. This increase in gain allows a significant increase in base doping, and corresponding decrease in base resistance, which would otherwise result in a decrease in current gain. Further, by varying the composition of the semiconductor alloy in the base as a function of position, a significant quasi-static field may be created that enhances the velocity of charge carriers in the base. Increased velocity, in turn, enables higher gain and cutoff frequency to be achieved than in transistors having a uniform semiconductor alloy composition throughout.

To increase the performance of an HBT, it is desirable to increase both the transient frequency $f_T$ and the maximum oscillation frequency $f_{MAX}$. $f_{MAX}$ is a function of $f_T$ and of parasitic resistances and parasitic capacitances (collectively referred to herein as "parasitics") between elements of the transistor according to the formula $fMAX=(f_T/8\pi^*C_{cb}^*R_b)^{1/2}$.

The parasitics of the HBT include the following parasitic capacitances and resistances, as listed in Table 1:

TABLE 1

| | |
|---|---|
| $C_{cb}$ | collector-base capacitance |
| $C_{eb}$ | emitter-base capacitance |
| $R_c$ | collector resistance |
| $R_e$ | emitter resistance |
| $R_b$ | base resistance |

The most significant parasitics are the collector-base capacitance $C_{cb}$ and the base resistance $R_b$ because they provide an electrical feedback path between the output and input of the transistor, reducing power gain and thus gain-dependent figures of merit including $f_{MAX}$. Their values are typically larger than the other parasitics, making their effects on $f_T$ and $f_{MAX}$ more pronounced. Thus, it is desirable to provide an HBT structure and method by which $C_{cb}$ and $R_b$ are significantly reduced.

An example of a state of the art heterojunction bipolar transistor (HBT) structure containing parasitics is illustrated in FIG. 1. As depicted in the cross-sectional view therein, an ideal or "intrinsic" device consists of a one-dimensional slice downward through the centerline 2 of the HBT, through emitter 4, intrinsic base layer 3, and collector 6. The emitter 4 is generally heavily doped with a particular dopant type, (e.g. n-type), and generally consists essentially of polycrystalline silicon (hereinafter, "polysilicon"). The intrinsic base 3 is predominantly doped with the opposite type dopant (e.g. p-type) than the emitter 4, and generally less heavily. The collector 6 is doped predominantly with the same dopant (e.g. n-type) as the emitter 4, but generally less heavily than the intrinsic base 3. Region 5 represents the depletion region disposed between the intrinsic base 3 and the collector 6, due to the p-n junction between the base and collector, which have different predominant dopant types. Region 7 represents the depletion region disposed between the intrinsic base 3 and the emitter 4, due to the p-n junction between the base and emitter, which have different predominant dopant types. Often, the intrinsic base 3 is formed of silicon germanium (SiGe), which is epitaxially grown on the surface of the underlying collector 6.

The ideal structure itself contains two capacitances that impact performance. There is the intrinsic emitter-base capacitance $C_{BE,I}$ at the junction 7 between the emitter 4 and the base 3. In addition, there is an intrinsic collector base capacitance $C_{CB,I}$ at the junction 5 between the collector and the base. These capacitances are related to the areas of the respective junctions, as well as to the quantities of dopant on either side of the respective junctions. Although these capacitances impact the power gain of the transistor, they are an inextricable part of the ideal transistor structure and thus cannot be fully eliminated.

Since a one-dimensional transistor, free of all material beyond the intrinsic device, cannot be realized in a practical process, typically a transistor contains additional parasitics stemming from interaction between the intrinsic device and other material structures in which the intrinsic device is embedded. Such structures help to provide electrical access and heat transfer to and from the intrinsic device. Among such additional parasitics, which have a key impact upon power gain is the extrinsic collector base capacitance $C_{CB,E}$ of which $C_{CX}$ and $C_{RX}$ are components, as shown in FIG. 1. The first component capacitance $C_{CX}$ results from interaction between the extrinsic base of the device and the collector pedestal. The second component capacitance $C_{RX}$ results from interaction between the extrinsic base of the device and the bulk substrate portion of the collector, between the edge of a shallow trench isolation 9 and the collector pedestal 6. An additional component capacitance $C_{PB}$ is the capacitance of the extrinsic base and substrate where separated by the STI. Provided that a given HBT fabrication process results in an STI having sufficient thickness to avoid substantial $C_{PB}$, the parasitic capacitances $C_{CB,I}$, $C_{CX}$ and $C_{RX}$ contribute more significantly to the overall collector base capacitance $C_{cb}$.

As illustrated in FIG. 2, the extrinsic base resistance $R_b$ is a second important parasitic element, representing the series resistance between the external base contact and the intrinsic base film. The components of the base resistance $R_b$ include: $R_{int}$, which is a function of the size of the emitter and the intrinsic base profile; $R_{sp+link}$, which is a function of the width of the spacer separating the raised extrinsic base from the emitter, as well as the interface quality of the link between the intrinsic base and the raised extrinsic base; $R_{poly}$, which is function of the thickness, doping and alignment of the edge of the silicide (when present) to the polysilicon layer 8 of the raised extrinsic base; and $R_{silicide}$, which is a function of the dimension of the polysilicon 8 over which a silicide 11 is disposed. The parasitic resistances $R_{poly}$ and $R_{silicide}$ contribute significantly to overall base resistance $R_b$.

Typically, moving the extrinsic base elements closer to the intrinsic device reduces $R_b$. However, such an approach tends to increase the extrinsic collector base capacitance $C_{CB,E}$, creating a fundamental tradeoff between the two parasitics and making it hard to improve overall power gain. Narrowing the collector pedestal itself can also reduce $C_{CB,E}$. Such a reduction is difficult to achieve, however, since the pedestal is typically formed by implantation of dopants, which tend to scatter laterally during implantation and to diffuse laterally during the typical heating that a transistor experiences during fabrication. Narrowing the collector pedestal also increases the series resistance ($R_C$) of the collector pedestal, impacting high frequency performance. Thus, it is desirable to avoid narrowing the collector pedestal, which adversely impacts $R_C$.

A structure and method of confining the lateral dimension of the collector pedestal near the point of interaction with the extrinsic base, while maintaining low $R_C$ and preserving tolerance against process thermal cycle would be of major advantage in improving the high-frequency gain of a bipolar transistor.

Therefore, it would be desirable to provide a structure and method of fabricating a bipolar transistor having reduced extrinsic collector base capacitance $C_{CB,E}$ without significantly impacting the extrinsic emitter base resistance $R_b$ or the collector resistance $R_C$, so as to achieve superior high-frequency power gain.

Commonly assigned, co-pending U.S. patent application Ser. No. 10/249,299 describes an HBT having reduced collector-base capacitance and resistance by vertically interposing first and second shallow trench isolation (STI) structures between the collector which underlies the STI and the raised extrinsic base which overlies the STI.

It would further be desirable to increase the transient frequency $f_T$ and maximum oscillation frequency $f_{MAX}$ through change in one or more of the vertical profiles of the collector, base, emitter and/or the junctions between them.

SUMMARY OF THE INVENTION

According to an aspect of the invention, a bipolar transistor is provided which includes a tapered, i.e. frustum-shaped, collector pedestal having an upper substantially planar surface, a lower surface, and a slanted sidewall extending between the upper surface and the lower surface, the upper surface having substantially less area than the lower surface. The bipolar transistor further includes an intrinsic base overlying the upper surface of the collector pedestal, a raised extrinsic base conductively connected to the intrinsic base and an emitter overlying the intrinsic base.

According to a preferred aspect of the invention, the emitter is self-aligned to the collector pedestal. Preferably, in such aspect of the invention, the emitter has a centerline which is aligned to a centerline of the collector pedestal.

According to another aspect of the invention, a method of fabricating a bipolar transistor is provided which includes a tapered, i.e. frustum-shaped, collector pedestal having an upper substantially planar surface, a lower surface, and a slanted sidewall extending between the upper surface and the lower surface, the upper surface having substantially less area than the lower surface. The method further includes forming an intrinsic base overlying the upper surface of the collector pedestal, forming a raised extrinsic base conductively connected thereto, and forming an emitter overlying the intrinsic base.

According to a preferred aspect of the invention, the emitter and the collector pedestal are both formed in the same opening etched into a layered stack of materials. Preferably, the emitter is self-aligned to the collector pedestal such that a centerline of the emitter is aligned to a centerline of the collector pedestal.

BRIEF DESCRIPTION OF THE DRAWINGS

FIGS. 4 through 9 illustrate a method of fabricating the heterojunction bipolar transistor shown in FIG. 3 according to an embodiment of the invention.

FIGS. 11 through 17 illustrate a method of fabricating the heterojunction bipolar transistor shown in FIG. 10, according to an embodiment of the invention.

DETAILED DESCRIPTION

The present invention provides a method and structure for forming a bipolar transistor having reduced collector-base capacitance ($C_{cb}$). Reducing the collector-base capacitance both increases the power gain and helps to reduce parasitic effects. The present invention achieves these results without significant impact to series resistance ($R_C$) or base resistance ($R_b$), thus enabling improvements to be achieved in the high-frequency gain of a bipolar transistor.

The bipolar transistor according to various embodiments described herein has a tapered collector structure for reducing the collector base capacitance $C_{cb}$ in comparison to bipolar transistors in which the collector extends under a substantial portion of the raised extrinsic base.

Figure 1:
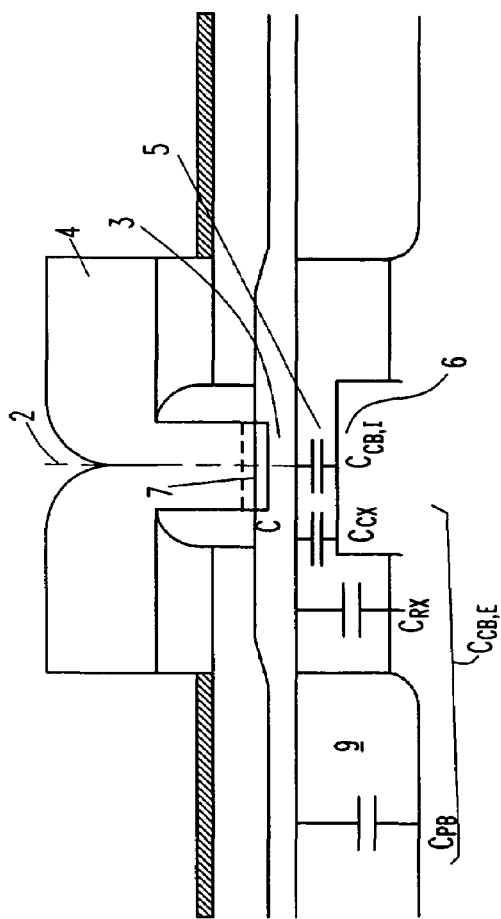
FIG. 1 illustrates components of collector base capacitance in relation to the structure of an HBT in accordance with the prior art.
Figure 2:
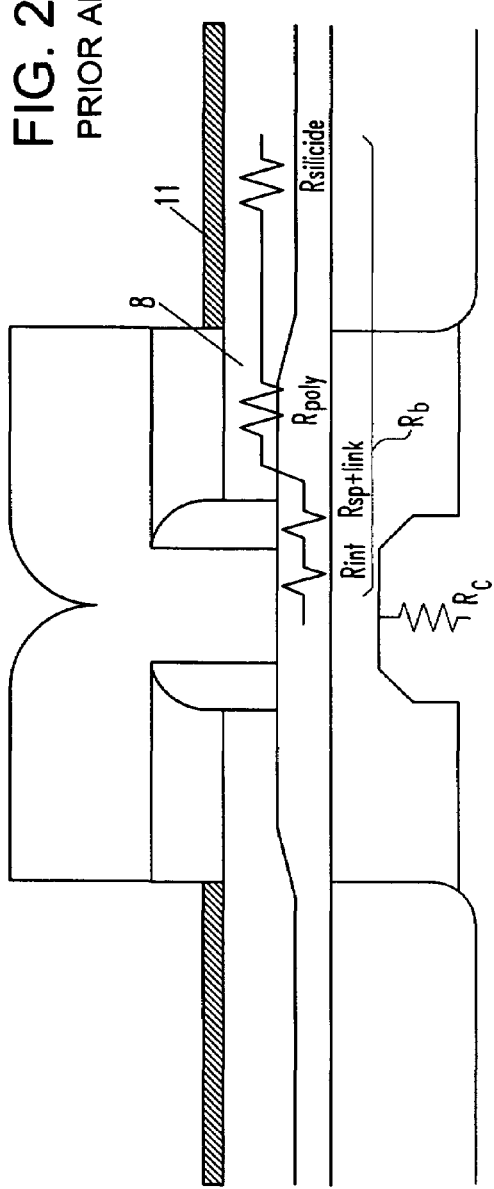
FIG. 2 illustrates components of base resistance and collector resistance in relation to the structure of an HBT in accordance with the prior art.
Figure 3:
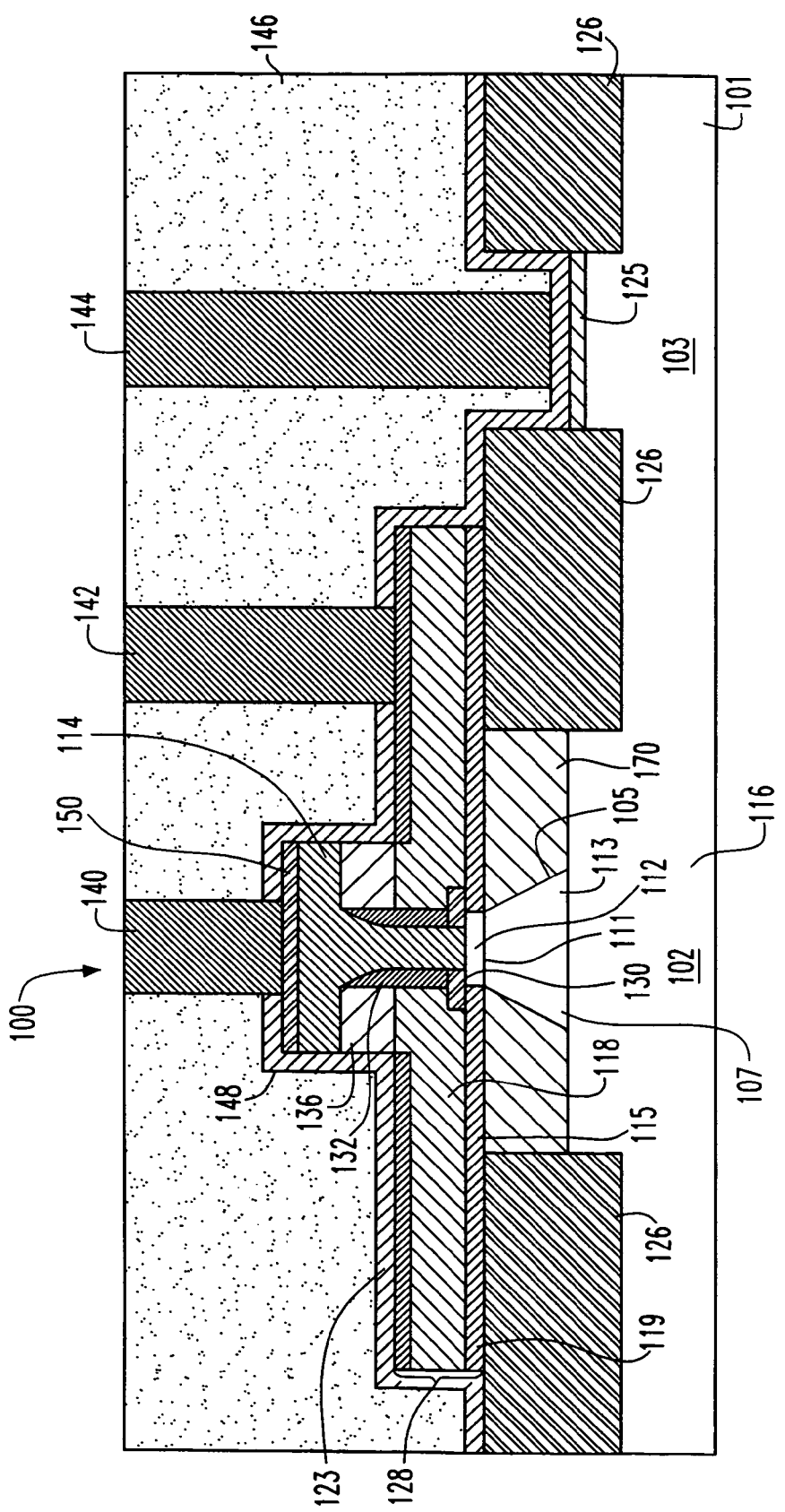
FIG. 3 illustrates a heterojunction bipolar transistor having a tapered collector according to one embodiment of the invention.

FIG. 3 is a cross-sectional view illustrating a heterojunction bipolar transistor (HBT) 100 according to a first embodiment of the invention. As shown in FIG. 3, HBT 100 is desirably fabricated from a substrate 101, e.g. wafer, of single-crystal silicon. As illustrated, The HBT 100 includes a collector region 116 over which a tapered, i.e. frustum-shaped, collector pedestal 113 is disposed, an intrinsic base 112 including a layer of single-crystal semiconductor alloy such as silicon germanium (SiGe) overlying the collector pedestal 113, and an emitter 114 disposed within an opening overlying the intrinsic base 112. When the HBT 100 is an npn type transistor, the tapered collector pedestal 113 desirably includes a semiconductor having an n-type dopant. The collector pedestal 113 is surrounded in one embodiment by a region 170 of dielectric material, resulting in a confined column of electrical conduction. In another embodiment, instead of dielectric material, the region 170 can be occupied by an undoped or very lightly doped semiconductor material, i.e., one having a dopant concentration of less than about $5 \times 10^{16} cm^{-3}$.

In the embodiment illustrated in FIG. 3, the frustum-shaped collector pedestal 113 has an upper surface 111, a lower surface 107, and a slanted sidewall 105 extending between the upper and lower surfaces. The frustum shape of the collector pedestal 113 results in the upper surface 111 having substantially less area than the lower surface 107 of the pedestal. The relatively small area of the upper surface 111 due to the frustum shape is advantageous as it provides a relatively large spacing to be achieved between the upper surface 111 of the collector pedestal 113 and the raised extrinsic base, reducing the capacitive interaction between the two, thus reducing the extrinsic collector capacitance $C_{CB,E}$. In addition, the frustum shape of the collector pedestal 113 having a slanted sidewall 105 provides for increasing cross-sectional area in the direction that current traverses the pedestal between the upper surface 111 and the lower surface 107. This tapered shape of the pedestal 113 mimics the natural flow of current in a bipolar transistor collector, which is typically confined near its point of origin in the emitter and spreads as it proceeds down the collector pedestal. Thus, the tapered collector pedestal shape reduces $C_{cb}$ without impacting $R_C$. The reduction in $C_{cb}$ also does not require moving the extrinsic base further from the pedestal and, thus, further from the intrinsic device, so that $R_b$ is not adversely impacted.

In the embodiment of FIG. 3, the extrinsic base for the HBT 100 is raised and referenced as 128. This raised extrinsic base 128 is formed as a stack which includes a semiconductor material including a polysilicon layer 118 disposed above the level of the intrinsic base 112 and overlying a polycrystalline layer 119 disposed at the same level as the intrinsic base 112. The raised extrinsic base 128 also includes a low resistance layer 123 disposed over the polysilicon layer 118 consisting essentially of a silicide and/or a metal.

The raised extrinsic base 128 partially extends over shallow trench isolation regions 126 provided to the sides of intrinsic base 112. A spacer 132 desirably is formed on a sidewall of the polysilicon layer 118 of the raised extrinsic base 128 and is preferably made of a nitride such as silicon nitride. An oxide layer 130, also referred to as the landing pad 130, is provided underneath the nitride spacer 132. The oxide layer 130 extends only between the raised extrinsic base of the HBT and the emitter, and does not extend vertically along the sidewall of the raised extrinsic base. The nitride spacer 132 extends vertically upwardly from the oxide layer 130 along a sidewall of the raised extrinsic base.

The raised extrinsic base 128 has an annular shape, surrounding the emitter 114, which extends downwardly to contact the intrinsic base 112 through an opening etched into the raised extrinsic base 128. A layer of oxide 136 separates an upper portion of the emitter from the layer of polysilicon 118. The emitter 114 desirably includes a low-resistance layer 150 that includes a metal and/or a metal silicide. The emitter can be made out of a variety of materials such as doped polysilicon. Vertical contact to each of the raised extrinsic base 128, emitter 114 and collector 116 from a overlying wiring level (not shown) are provided through metal or metal-silicide filled vias 140, 142, and 144 that are etched into an overlying deposited interlevel dielectric layer (ILD) 146. Desirably, ILD 146 consists essentially of a deposited oxide, for example a silicon dioxide such as a TEOS oxide or borophosphosilicate glass (BPSG).

A method of fabricating an HBT 100 as illustrated in FIG. 3 will now be described, with reference to FIGS. 3 through 9. This method of fabrication requires precise lithographic alignment to provide a bipolar transistor having an emitter layer closely aligned to the collector pedestal as provided in FIG. 3.

Figure 4:
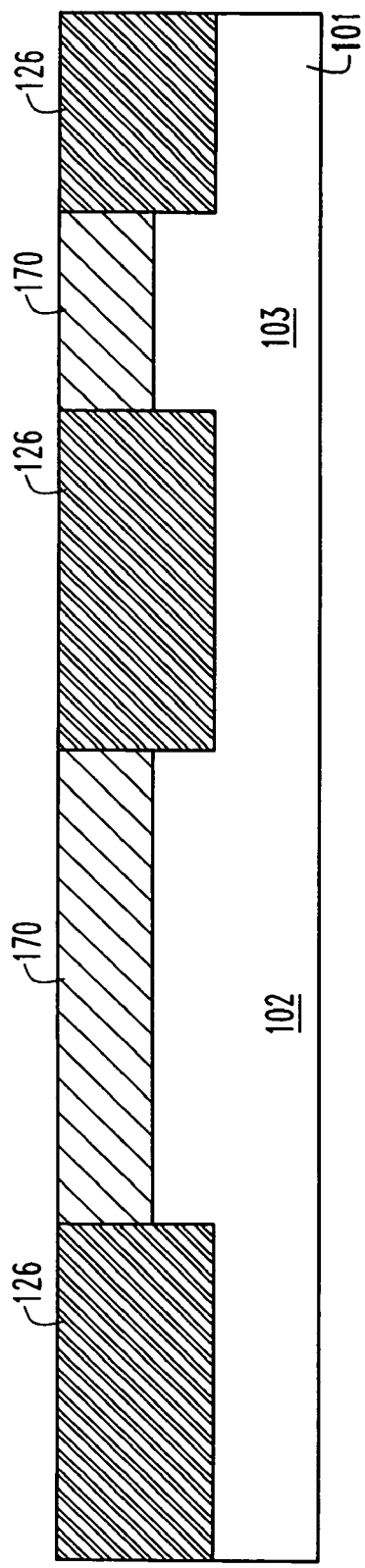

As depicted in FIG. 4, a single-crystal silicon substrate 101 is patterned to form a first active area 102 and a second active area 103, and shallow trench isolations 126 between the active areas 102 and 103. The collector pedestal will be formed over the active region 102. Desirably, the shallow trench isolations (STI) 126 are formed by etching trenches into the substrate 101 by reactive ion etching, using the nitride layer 170 as a hard mask. The trenches are then filled with a dense oxide, such as may be provided by a high electron density plasma (HDP) deposition.

Figure 5:
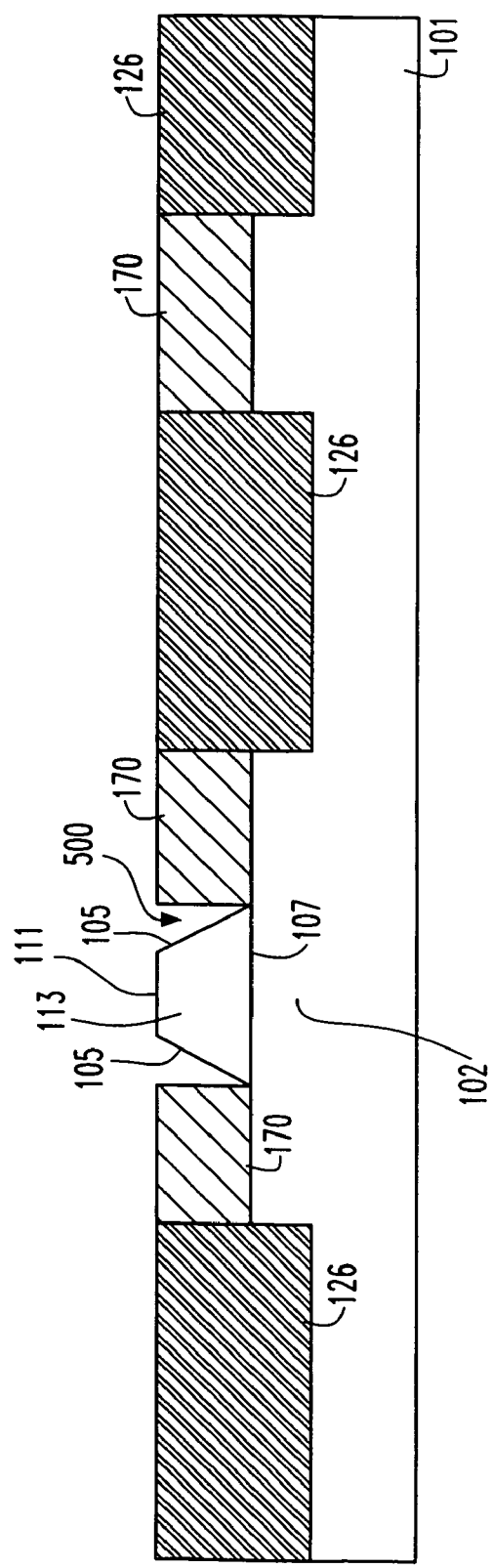

With reference to FIG. 5, a layer of photoresist (not shown) is deposited and lithographically patterned to form an opening 500 in the nitride layer 170 over the active area 102, as by a reactive ion etch (RIE). The ultimate pedestal alignment will depend on the capabilities of the lithography tool and the size of the opening 500. Therefore, tools with excellent lithography registration should be utilized to create a very small opening of preferably slightly larger than 0.2 microns.

Once the opening 500 is formed, a selective epitaxial technique is used such as chemical vapor deposition (CVD) to grow single-crystal semiconductor material on the exposed active area 102 to form the tapered collector pedestal 113. This material adheres and grows into a film only in exposed, unmasked portions of the substrate (i.e. in the opening 500), forming a column of material. The natural physics of epitaxial growth causes this column to grow increasingly narrow as it grows in height, forming the desired tapered shape of pedestal 113, as shown in FIG. 5. Control over the pressure and chemistry within the growth apparatus controls the angle at which the slanted sidewall 105 makes with the lower surface 107. In addition, the final dimension of the upper surface 111 is controlled by the duration of growth and depth of opening 500. Dopant may also be introduced into the pedestal either during the growth process (i.e. in situ) or through subsequent diffusion or implantation steps.

In an alternative embodiment, instead of epitaxially growing the tapered collector pedestal 113, the pedestal dimensions and shape are defined instead by etching. In such case, the starting material is a semiconductor wafer having a layer at the surface having the desired material for the collector pedestal. The wafer is masked using a material such as a patterned photoresist or hardmask material such as silicon nitride somewhat larger than the dimension of the desired final size of the upper surface 111 (FIG. 3) of the collector pedestal, to account for lateral etching. The wafer is then placed in an etchant which removes exposed semiconductor material and leaves behind material which is under and protected by the masking material. By proper selection of the etchant, the etching process will take place along natural crystalline planes, resulting in a collector pedestal having slanted sidewalls 105. Similar to the grown pedestal, dopant may be introduced either into the initial starting material or after formation of the pedestal by way of diffusion or implantation.

Figure 6:
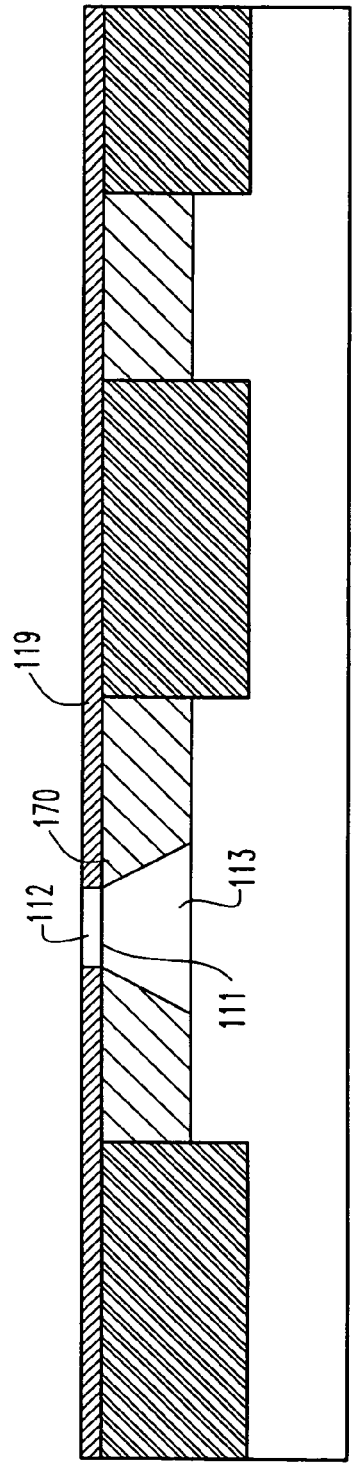

Thereafter, as illustrated in FIG. 6, a dielectric fill material 170, such as silicon nitride is deposited to fill the opening 500 surrounding the pedestal 113. A subsequent planarizing step such as performed by chemical-mechanical polishing (CMP) can be then used to planarize the top surface, revealing the top surface 111 of the collector pedestal 113. In a preferred embodiment, a subsequent recess etch-back step can also be performed to recess the nitride fill 170 to expose a larger portion of the pedestal 113.

The formation of the collector pedestal 113 and the dielectric fill 170 results in an at least a nearly planar if not planar surface, on which the base and emitter layers of the HBT 100 are subsequently formed. A variety of techniques may be utilized to complete the HBT 100. In this way, the tapered collector may be considered modular, largely independent of subsequent processing steps.

Steps to form the base of the HBT 100 include the growth of an intrinsic base 112 of single-crystal semiconductor material over the upper surface 111 of the collector pedestal using non-selective epitaxy, during which a polycrystalline layer 119 is simultaneously deposited onto an upper surface of the fill region 170 and STI region 126. In one embodiment of the invention, a layer of SiGe is grown as the intrinsic base 112 of the transistor. In this way, a heterojunction results between the base and the collector and/or the subsequently formed emitter. Desirably, the SiGe layer has a germanium content which is greater than 20%, while the silicon content makes up a complementary percentage.

Figure 7:
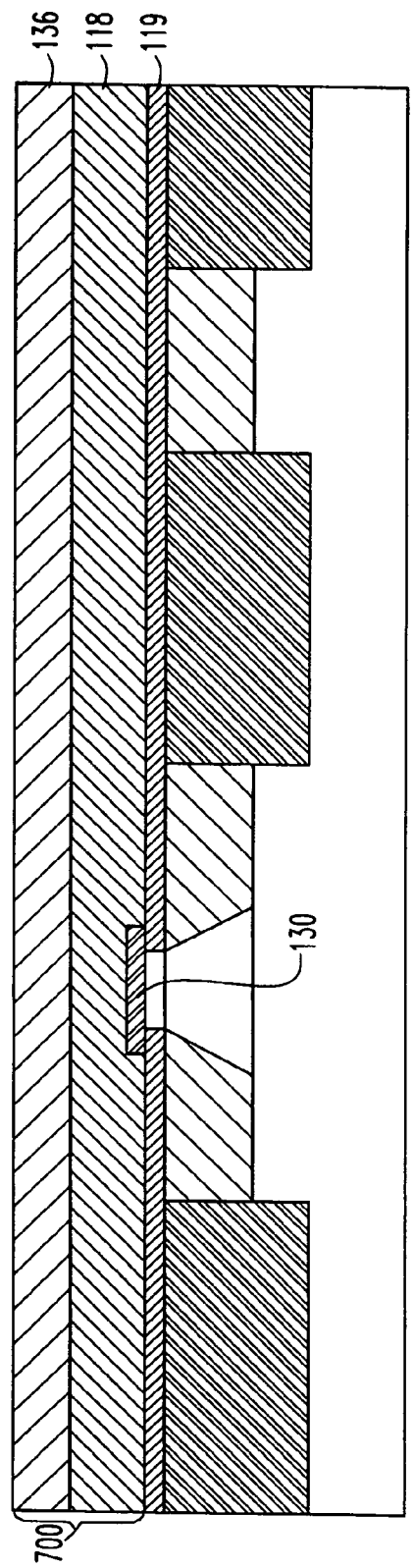

Thereafter, with reference to FIGS. 7 through 9, steps are performed to complete the structure of the HBT 100 including steps for forming the emitter 114. FIGS. 7 through 9 illustrate the steps of a exemplary embodiment in which a T-shaped emitter is formed having an upper portion which is broader than the lower portion which contacts the intrinsic base, the broad upper portion serving as a conductive land onto which contact is made to the emitter through a conductive via, as shown in FIG. 3. Thus, the steps described herein illustrate one of several available ways to complete the HBT structure 100. As illustrated in FIG. 7, a patterned oxide layer 130 is formed as a landing pad over the intrinsic base 112. The patterned oxide layer 130 is formed by blanket depositing an oxide, e.g. silicon dioxide from a TEOS (tetraethylorthosilicate) precursor, over the structure shown in FIG. 6, and then photolithographically patterning a blocking pattern in a photoresist layer and etching the oxide layer, selective to the underlying material of the polycrystalline base layer 119, the blocking pattern defining the location and extent of the patterned oxide layer 130. Thereafter, a layered stack 700 is formed. The stack 700 is created by the deposition of a thick layer of polysilicon 118 over the polycrystalline layer 119 and over the oxide layer 130. Another layer of oxide 136 is then deposited over the polysilicon layer 118, as illustrated, to complete the formation of stack 700.

Thereafter, as illustrated in FIG. 8, an emitter opening 800 is formed in the layered stack 700 and a nitride spacer 132 is formed on a sidewall of the emitter opening. The opening 800 is formed as by lithographically patterning a layer of photoresist (not shown) over the oxide layer 136 and then etching, as by RIE, the oxide layer 136 with the photoresist pattern. The polysilicon layer 118 is then etched selectively to oxide to expose the underlying oxide layer 130, again as by RIE, with the oxide layer 136 serving as a hardmask. To preclude shorting of the raised extrinsic base to the emitter, the opening 800, after the sidewall spacer 132 is formed therein, must completely overlie the patterned oxide layer 130.

As illustrated in FIG. 9, a series of steps are performed to form the T-shaped emitter 114 of the HBT 100. To permit conductive contact to the intrinsic base 112 from within the opening 800, a wet etch of the oxide layer 130 is performed. This wet etch is performed selective to the semiconductor material of the intrinsic base 112 to remove the oxide layer 130 from inside the emitter opening 800, thereby exposing the intrinsic base 112. Thereafter, a layer 114 of polysilicon is deposited to contact the intrinsic base 112 and fill the opening 800 between spacer 132, while also being deposited over the structure including over the oxide layer 136. Thereafter, a layer of nitride 920 is deposited over the polysilicon layer 114. The stack 900 including polysilicon layer 114 and the nitride layer 920 is then patterned, as by RIE, to the final dimension of the upper portion 914 of the T-shaped emitter. For example, a photoresist is deposited and photolithographically patterned, followed by RIE patterning of the nitride layer 920, selective to the photoresist. Then, the photoresist is removed and the polysilicon layer 114 is RIE patterned, selective to nitride and selective to the underlying oxide layer 136.

With reference to FIG. 3, polysilicon layer 118 and polycrystalline layer 119 are now patterned to the final dimensions of the raised extrinsic base 128. This is performed, for example, by photolithographically patterning a photoresist layer overlying the structure including the patterned stack 900, then RIE patterning, first the oxide layer 136, and then the polysilicon layer 118 and polycrystalline base layer 119 selective to oxide. After such patterning, upper surfaces of isolation areas 126 are at least partially exposed, as is nitride region 190 which overlies active area 103. A wet etch is then performed to remove exposed nitride material including nitride region 920 overlying the emitter 114 and nitride region 190 overlying active area 103.

Thereafter, to achieve the final HBT 100 structure illustrated in FIG. 3, additional steps are performed. Silicide layers 150, 123 and 125 are desirably formed on exposed surfaces of polysilicon layers 114 and 118, respectively, and the exposed surface of the single-crystal silicon collector reachthrough area 103. Silicide layers 150, 123 and 125 are formed by depositing a metal, e.g. nickel, cobalt, or tungsten, that readily reacts with silicon under appropriate conditions to form a silicide, and thereafter applying the appropriate conditions, e.g., moderately high temperature. Thereafter, unreacted metal is removed, as by etching selective to the silicide, leaving the silicide in place.

A layer of nitride 148 is then conformally deposited over the structure, followed by deposition of a thick interlevel dielectric layer (ILD) 146. The interlevel dielectric 146 desirably consists essentially of a highly flowable deposited oxide, for example, silicon dioxide such as deposited from a TEOS precursor or borophosphosilicate glass (BPSG). Vertical contact vias 140, 142, and 144 are then etched in the ILD 146 and thereafter filled with a metal or metal-silicide to complete the HBT structure 100 illustrated in FIG. 3.

Figure 10:
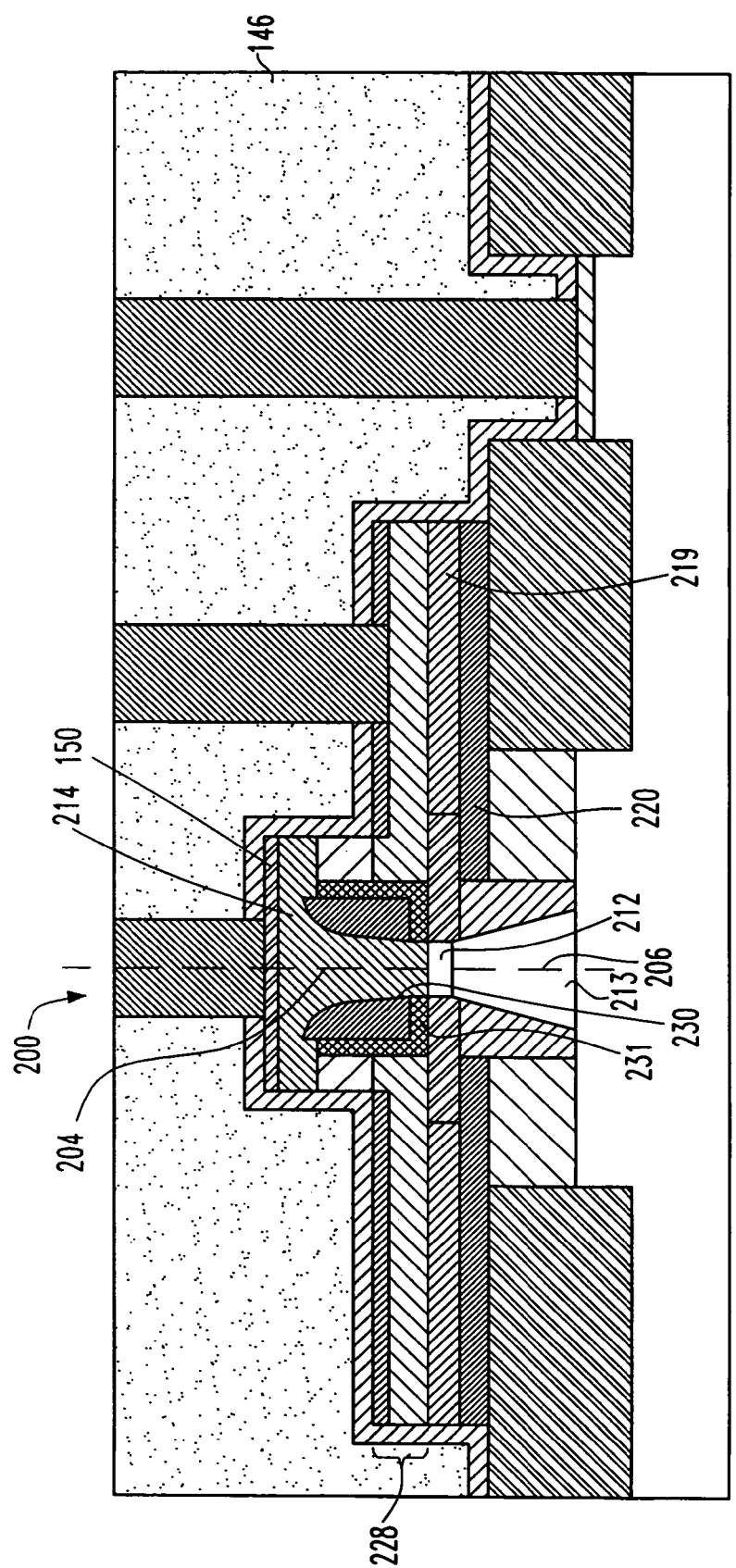
FIG. 10 illustrates a heterojunction bipolar transistor having a tapered collector according to another embodiment of the invention.

An HBT structure 200 according to another embodiment of the invention will now be described, with reference to FIG. 10. FIG. 10 provides a cross-sectional view of the HBT structure 200. The HBT structure 200 is similar to the HBT structure 100 shown and described above with reference to FIG. 3 except for differences as noted herein.

As illustrated in FIG. 10, the HBT structure 200 has a raised extrinsic base 228 that is self-aligned to the emitter 214, as spaced therefrom by lower insulating spacer 231 and upper insulating spacer 230, both of which are self-aligned to the emitter 214. Unlike that of HBT 100, in HBT 200 the emitter 214 is also self-aligned to the collector pedestal 213 such that the centerline of the emitter 204 is aligned to the centerline 206 of the collector pedestal. Because of the self-aligned structure of HBT 200, when fabricating HBT 200, one need not allow for lithographic overlay tolerance between the emitter and collector pedestal. Consequently, the overall dimensions of HBT 200 can be reduced to a greater degree than in the above-described embodiment, thus leading to greater performance, i.e. higher $f_T$ and $f_{MAX}$. HBT 200 also differs from HBT 100 in the inclusion of additional isolating layers 219 and 220 between the raised extrinsic base 228 and the collector pedestal 213. The intrinsic base 212 is provided as an epitaxial layer disposed horizontally adjacent to the isolation layer 219.

A method of fabricating the HBT 200 will now be described, with reference to FIGS. 10-17. As illustrated in FIG. 11, processing begins by forming a structure in the manner as described above with reference to FIG. 8 to form shallow trench isolation (STI) regions 226, a first active area 202 and a second active area 203 disposed between the STI regions 226, and silicon nitride regions 270 disposed over the active areas 202, 203. Thereafter, a layered stack including silicon nitride layer 220, silicon dioxide layer 219, polysilicon layer 218 and oxide layer 236 are deposited over the structure.

With reference to FIG. 12, the layered stack 222 and the underlying silicon nitride layer 270 are photolithographically patterned and etched, as by RIE, to form an opening 250 extending from the top of oxide layer 236 to the active area 202. The collector pedestal and the emitter will both be formed in this opening, as will be described below. A dielectric spacer 272, preferably consisting essentially of silicon nitride, is then formed on a sidewall of the opening 250. The processing to form the spacer is preferably tightly controlled, to result in a spacer having a well-controlled thickness, for reasons which will become apparent below. After RIE processing and formation of the spacer 272, post-etch clean procedures are preferably performed to the active area 202, e.g. by slight thermal oxidation of the surface of active area 202, followed by a wet oxide etch selective to silicon.

Figure 13:
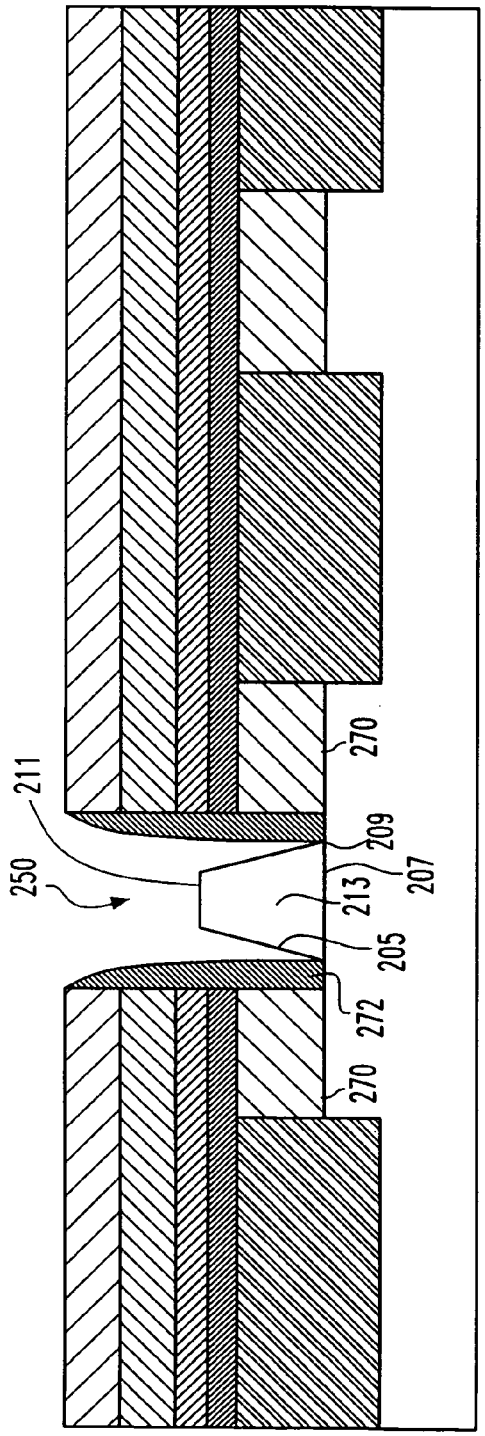

As shown in FIG. 13, a selective epitaxial growth process is employed to grow a collector pedestal 213 upwardly from the surface of the active area 202 within opening 250. As in the embodiment described above relative to FIGS. 3-9, selective epitaxial growth results in a frustum-shaped collector pedestal 213 having an upper surface 211, a lower surface 207, and a slanted sidewall 205 extending between the upper surface and the lower surface.

As also illustrated in FIG. 13, the collector pedestal 213 has a lower edge 209 which is spaced from the edge of the previously formed silicon nitride region 270 by the width of the spacer 272. By controlling the width of the spacer 272, additional control can be exercised over the area of the lower surface 207 of the collector pedestal 213, and thereby, the area of the upper surface 211.

Figure 14:
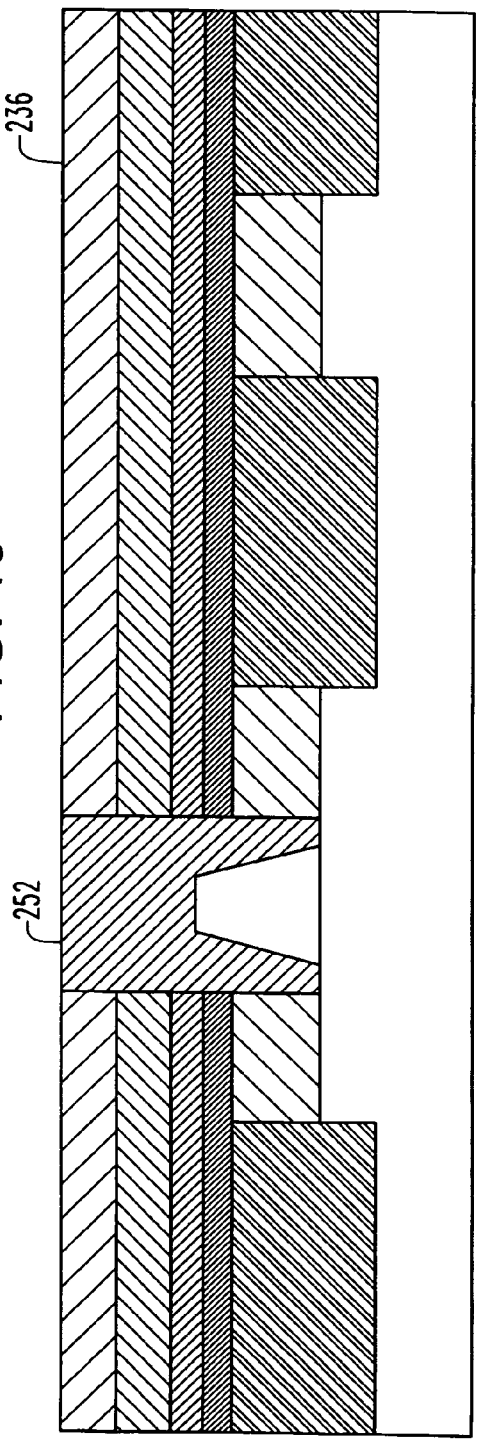
Figure 15:
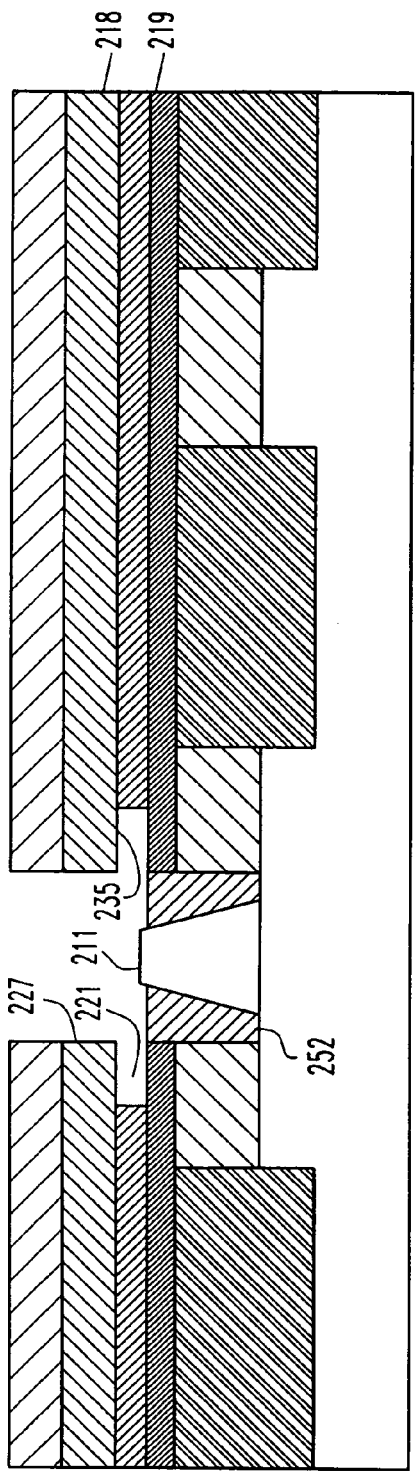

As illustrated in FIG. 14, a blanket deposition of silicon nitride is performed to form a silicon nitride fill 252, which is then planarized to the surface of the oxide layer 236, as by an etch-back process, e.g. RIE, or chemical mechanical polishing (CMP). With reference to FIG. 15, the nitride fill 252 is then recessed within the opening 250 to clear the upper surface 211 of the collector pedestal and expose the sidewalls 227 of polysilicon layer 218. Thereafter, a wet etch selective to nitride and to polysilicon is performed to recess the oxide layer 219 to form an undercut region 221 under the polysilicon layer 218 which will later form a part of the raised extrinsic base. As a result of this etch, a lower surface 225 of the polysilicon layer is exposed.

Figure 16:
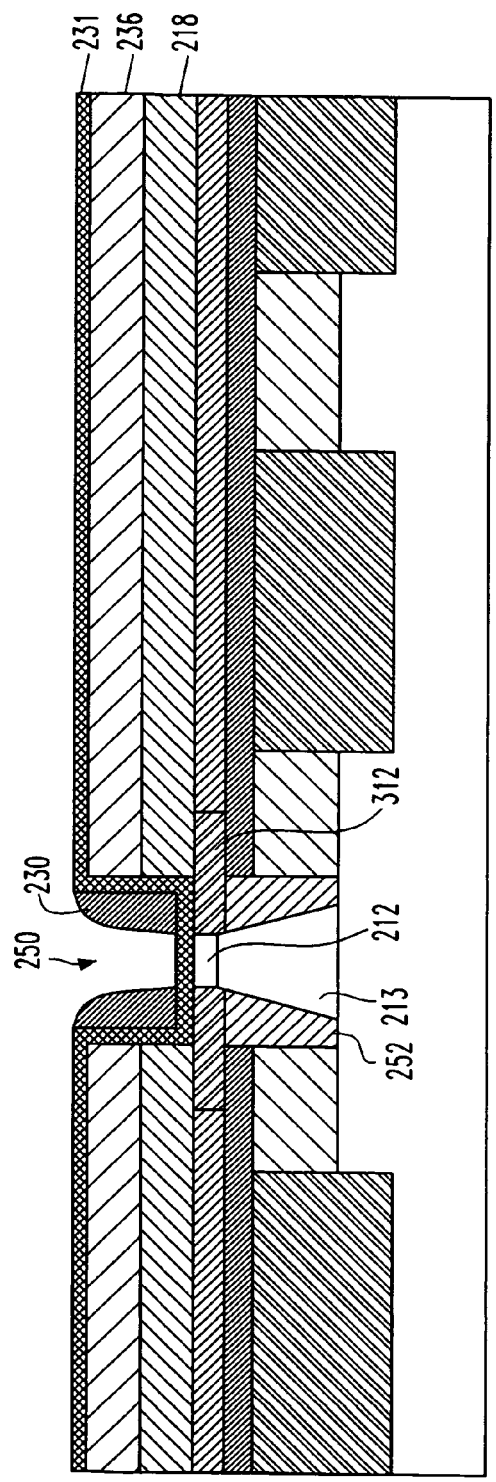
Figure 17:
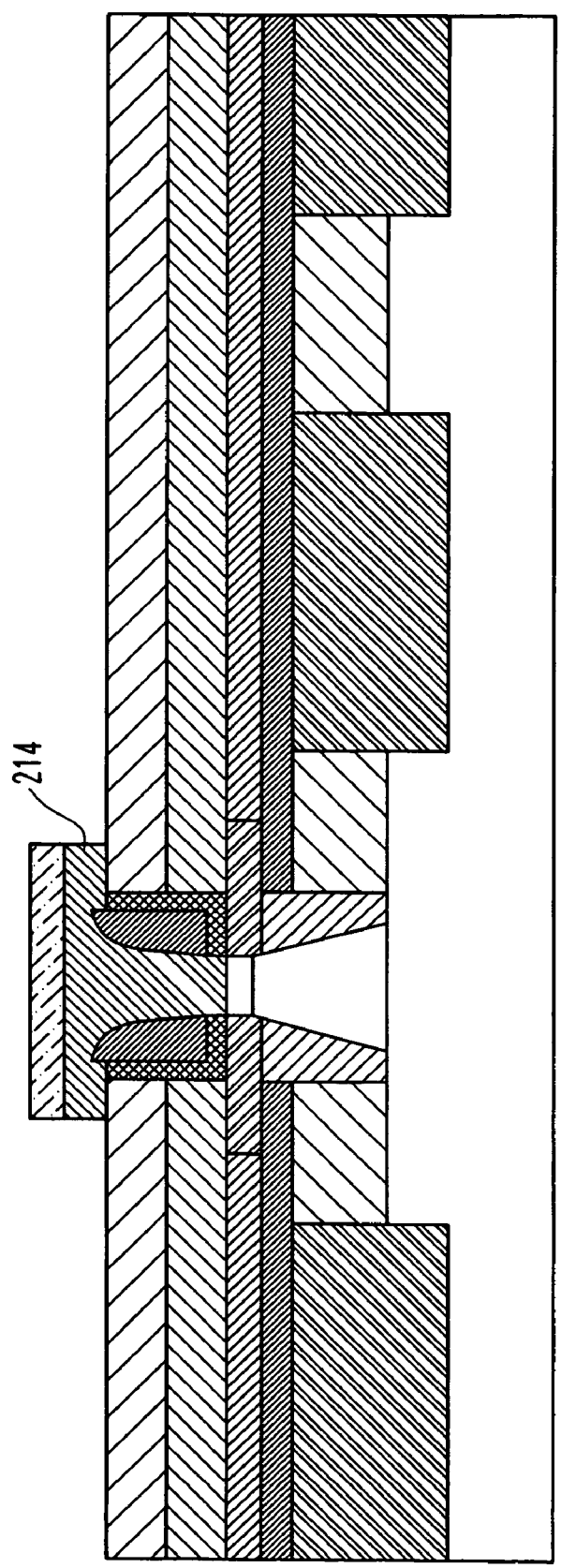

With reference to FIG. 16, thereafter, an epitaxial growth process is used to form the intrinsic base layer 212 of the HBT 200. As a result of such process, an intrinsic base 212 is formed including a single-crystal layer of silicon germanium (SiGe) overlying the collector pedestal 213, while a polycrystalline SiGe layer 312 is formed in the undercut region 221 under the polysilicon layer 218. This process is preferably performed as a selective epitaxial growth process, such that the polycrystalline SiGe layer 312 is deposited onto the lower surface 225 and sidewall 227 (FIG. 15) of the polysilicon raised extrinsic base layer 218, but not on surfaces of the oxide layer 236. When selectively deposited, the polycrystalline SiGe layer 312 grows downwardly from the lower surface 225 of the polysilicon layer 218 and outwardly from the single-crystal portion of the layer 212 to fill the space overlying the nitride fill 252, as shown in FIG. 16.

Alternatively, the intrinsic base 212 and polycrystalline SiGe layer 312 can be formed by a blanket epitaxial growth and deposition process, resulting in some semiconductor material being deposited onto surfaces of the oxide layer 236. In such case, the blanket deposited SiGe material must thereafter be etched back from the surfaces of at least the oxide layer 236 prior to proceeding to the next stage of fabrication.

As further shown in FIG. 16, the next stage of fabrication includes the formation of a conformal oxide layer 231 over the intrinsic base 212, lining sidewalls of the opening 250 and overlying the surface of the oxide layer 236. A spacer 230, preferably consisting essentially of silicon nitride, is then formed overlying the oxide layer 231, as by conformally depositing silicon nitride and then vertically etching the structure by RIE, selective to oxide. Thereafter, with reference to FIG. 17, the polysilicon layer of the emitter 214 is patterned by the same processing as shown and described above with reference to FIG. 9. Referring to FIG. 10 again, the raised extrinsic base 218 is then patterned by the same processing as shown and described above with reference to FIG. 3. Finally, additional processing is performed to complete the HBT 200, which is the same as that shown and described above with reference to FIG. 3.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of making a bipolar transistor, comprising:
defining a collector active region of single-crystal semiconductor material having a surface extending in a first lateral direction and a second lateral direction transverse to the first lateral direction;
forming layered stack including a first dielectric region and a second dielectric region overlying the first dielectric region, each of the first and second dielectric regions overlying the collector active region;
defining an opening extending through the first and second dielectric regions to expose a surface of the collector active region, the opening defining edges of the first and second dielectric regions, the edges being aligned in a vertical direction transverse to the first and second lateral directions;
forming a frustum-shaped collector pedestal on the surface of the collector active region exposed within the opening, the collector pedestal having an edge referenced to the edge of the first dielectric region and having an upper surface, a lower surface, and a slanted sidewall extending between the upper surface and the lower surface, wherein the upper surface has an area substantially less than an area of the lower surface;
forming an intrinsic base overlying all of the upper surface of the collector pedestal;
forming an extrinsic base conductively connected to the intrinsic base;
forming an emitter overlying the intrinsic base, the emitter having an edge referenced to the edge of the second dielectric region, such that the emitter is aligned with the collector pedestal in the vertical direction.

2. A method of making a bipolar transistor as claimed in claim 1, further comprising providing a region contacting the slanted sidewall of the collector pedestal, the region consisting essentially of silicon nitride.

3. A method of making a bipolar transistor as claimed in claim 2, wherein the region consisting essentially of silicon nitride extends between a shallow trench isolation and the slanted sidewall of the collector pedestal.

4. A method of making a bipolar transistor as claimed in claim 1, wherein the collector pedestal is formed by epitaxial growth onto the surface of the collector active region.

5. A method of making a bipolar transistor as claimed in claim 1, wherein the intrinsic base includes a layer of a single-crystal semiconductor material which forms a heterojunction with at least one of the emitter and the collector pedestal.

6. A method of making a bipolar transistor as claimed in claim 1, further comprising forming a collector contact region of single-crystal semiconductor material separated in at least one of the first and second lateral directions from the collector active region by a shallow trench isolation extending to a depth below the lower surface of the collector pedestal, and forming a conductive via in conductive communication with the collector contact region.

7. A method of making a bipolar transistor as claimed in claim 1, wherein at least a portion of the extrinsic base is raised above an upper surface of the intrinsic base and an edge of the raised portion of the extrinsic base is aligned in the vertical direction with the edges of the first and second dielectric regions.

8. A method of making a bipolar transistor as claimed in claim 7, further comprising forming a solid dielectric spacer spacing the raised portion of the extrinsic base from the emitter, the solid dielectric spacer including (a) a first dielectric spacer wholly contacting a wall of the raised portion of the extrinsic base, and (b) a second dielectric spacer contacting an inner wall of the first dielectric spacer remote from the raised portion of the extrinsic base.

* * * * *